United States Patent
Tsujino et al.

(10) Patent No.: US 10,971,322 B2
(45) Date of Patent: Apr. 6, 2021

(54) ELECTRON GUN, X-RAY GENERATION APPARATUS, AND X-RAY IMAGING APPARATUS

(71) Applicant: Canon Anelva Corporation, Kawasaki (JP)

(72) Inventors: Kazuya Tsujino, Tokyo (JP); Ichiro Nomura, Atsugi (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 16/864,934

(22) Filed: May 1, 2020

(65) Prior Publication Data
US 2020/0258710 A1 Aug. 13, 2020

Related U.S. Application Data

(63) Continuation of application No. PCT/JP2018/048608, filed on Dec. 28, 2018.

(51) Int. Cl.
*H01J 35/06* (2006.01)
*G01N 23/04* (2018.01)

(52) U.S. Cl.
CPC ............ *H01J 35/064* (2019.05); *G01N 23/04* (2013.01); *H01J 35/066* (2019.05); *G01N 2223/204* (2013.01)

(58) Field of Classification Search
CPC . G01N 2223/204; G01N 23/04; H01J 35/064; H01J 35/066; H01J 35/04; H01J 35/065; H01J 35/14
See application file for complete search history.

(56) References Cited

U.S. PATENT DOCUMENTS

| | | | | |
|---|---|---|---|---|
| 4,091,311 A | * | 5/1978 | Mendelsohn | H01J 3/02 313/455 |
| 5,834,781 A | * | 11/1998 | Fukuhara | H01J 37/06 250/423 F |

(Continued)

FOREIGN PATENT DOCUMENTS

| | | |
|---|---|---|
| JP | 2000030641 A | 1/2000 |
| JP | 200048746 A | 2/2000 |

(Continued)

OTHER PUBLICATIONS

English translation of JP2012004060 (Year: 2012).*

(Continued)

*Primary Examiner* — Dani Fox
*Assistant Examiner* — Soorena Kefayati
(74) *Attorney, Agent, or Firm* — Buchanan Ingersoll & Rooney PC

(57) ABSTRACT

An electron gun includes a cathode including an electron emitting portion, an extraction electrode for extracting electrons emitted from the electron emitting portion, and a focusing electrode for focusing the electrons extracted by the extraction electrode. The focusing electrode includes an outside electrode having a tubular shape, and an inside electrode arranged inside the outside electrode. The inside electrode defines a first space having a columnar shape, and includes a first surface on a side of the cathode, and a second surface on an opposite side of the first surface. An inside surface of the outside electrode and the second surface of the inside electrode define a second space. The inside electrode includes an electron passage hole, and a communicating portion which makes the first space and the second space communicate with each other.

13 Claims, 13 Drawing Sheets

(56) References Cited

U.S. PATENT DOCUMENTS

| | | | |
|---|---|---|---|
| 8,884,225 B2 | 11/2014 | Karimata et al. | |
| 2001/0002208 A1* | 5/2001 | Matsushita | H01J 35/14 378/138 |
| 2007/0076849 A1* | 4/2007 | Bard | H01J 35/147 378/121 |
| 2009/0245468 A1* | 10/2009 | Zou | H01J 35/065 378/122 |
| 2010/0127170 A1* | 5/2010 | Fujita | H01J 35/064 250/310 |
| 2011/0235785 A1* | 9/2011 | Behling | H01J 35/045 378/138 |
| 2012/0121069 A1* | 5/2012 | Aoki | H05G 1/12 378/98.8 |
| 2012/0250827 A1* | 10/2012 | Jeong | H01J 35/14 378/122 |
| 2012/0307974 A1* | 12/2012 | Yamazaki | H01J 35/066 378/62 |
| 2013/0022173 A1* | 1/2013 | Jeong | H01J 35/04 378/122 |
| 2013/0028386 A1* | 1/2013 | Jeong | H01J 35/20 378/122 |
| 2013/0034207 A1* | 2/2013 | Aoki | H01J 35/16 378/62 |
| 2014/0139147 A1* | 5/2014 | Balakin | H05H 7/04 315/503 |
| 2014/0169523 A1* | 6/2014 | Frontera | H01J 35/06 378/62 |
| 2014/0233696 A1* | 8/2014 | Utsumi | H01J 35/08 378/21 |
| 2014/0254755 A1* | 9/2014 | Tsujino | H01J 35/147 378/62 |
| 2014/0361168 A1* | 12/2014 | Ogawa | H01J 37/244 250/310 |
| 2015/0022080 A1* | 1/2015 | Umbach | H01J 3/04 315/12.1 |
| 2016/0254116 A1* | 9/2016 | Ukita | H01J 35/066 378/138 |
| 2018/0158640 A1* | 6/2018 | Choi | H01J 29/085 |
| 2018/0190466 A1* | 7/2018 | Park | H01J 35/065 |
| 2018/0247787 A1* | 8/2018 | Jeong | G21K 1/02 |
| 2018/0366294 A1* | 12/2018 | Miyaoka | H01J 35/066 |
| 2020/0144016 A1* | 5/2020 | Kim | H01J 35/112 |
| 2020/0154552 A1* | 5/2020 | Suzuki | H05G 1/30 |

FOREIGN PATENT DOCUMENTS

| | | | |
|---|---|---|---|
| JP | 2007265917 A | | 10/2007 |
| JP | 2011134498 A | | 7/2011 |
| JP | 2012004060 | * | 1/2012 |
| JP | 2012004060 A | | 1/2012 |
| TW | 201330043 A | | 7/2013 |

OTHER PUBLICATIONS

International Search Report (PCT/ISA/210) dated Mar. 12, 2019, by the Japanese Patent Office as the International Searching Authority for International Application No. PCT/JP2018/048608.

Written Opinion (PCT/ISA/237) dated Mar. 12, 2019, by the Japanese Patent Office as the International Searching Authority for International Application No. PCT/JP2018/048608.

Office Action dated Oct. 23, 2020, by the Taiwanese Patent Office in corresponding Taiwanese Patent Application No. 108146822, and an English Translation of the Office Action. (12 pages).

* cited by examiner

ELECTRON GUN, X-RAY GENERATION APPARATUS, AND X-RAY IMAGING APPARATUS

CROSS-REFERENCE TO RELATED APPLICATION

This application is a continuation of International Patent Application No. PCT/JP2018/048608 filed on Dec. 28, 2018, the entire disclosure of which is incorporated herein by reference.

TECHNICAL FIELD

The present invention relates to an electron gun, an X-ray generation apparatus, and an X-ray imaging apparatus.

BACKGROUND ART

An electron gun is used in, for example, an X-ray generation apparatus that generates X-rays. The electron gun can include, for example, an extraction electrode that extracts electrons, and a focusing electrode that focuses the electrons extracted by the extraction electrode. PTL 1 describes an X-ray tube incorporating an electron gun. The X-ray tube described in PTL 1 includes a cathode, a target, a first control grid arranged between the cathode and the target, and a second control grid arranged between the first control grid and the target. The cathode, the first control grid, and the second control grid are understood as the constituent elements of the electron gun. The second control grid includes an opening limiting element. When the opening limiting element is provided, a small beam dimension can be obtained.

CITATION LIST

Patent Literature

PTL 1: Japanese Patent Laid-Open No. 2007-265917

SUMMARY OF INVENTION

Technical Problem

However, when the opening limiting element is provided, a space where the movement of a gas is limited is formed between the opening limiting element and the cathode. When electrons collide against the opening limiting element, a gas can be emitted from the opening limiting element. The gas can stay for a long time in the space between the opening limiting element and the cathode. If electrons from the cathode collide against the gas, the gas is ionized. The thus generated ions are accelerated toward the cathode and can collide against the cathode. This can cause degradation of the cathode.

It is an object of the present invention to provide a technique advantageous in suppressing degradation of a cathode.

Solution to Problem

According to the first aspect of the present invention, there is provided an electron gun, and the electron gun comprises a cathode including an electron emitting portion, an extraction electrode configured to extract electrons emitted from the electron emitting portion, and a focusing electrode configured to focus the electrons extracted by the extraction electrode. The focusing electrode includes an outside electrode having a tubular shape, and an inside electrode arranged inside the outside electrode, the inside electrode defines a first space having a columnar shape, and includes a first surface on a side of the cathode, and a second surface on an opposite side of the first surface, and an inside surface of the outside electrode and the second surface of the inside electrode define a second space. The inside electrode includes an electron passage hole through which the electrons pass, and a communicating portion configured to make the first space and the second space communicate with each other.

According to the second aspect of the present invention, there is provided an X-ray generation apparatus, and the X-ray generation apparatus comprises: an electron gun according to the first aspect of the present invention, and an anode including a target configured to generate X-rays when electrons from the electron gun collide.

According to the third aspect of the present invention, there is provided an X-ray imaging apparatus, and the X-ray imaging apparatus comprises: an X-ray generation apparatus according to the second aspect of the present invention; and an X-ray detection apparatus configured to detect X-rays radiated from the X-ray generation apparatus and transmitted through an object.

Advantageous Effects of Invention

According to the present invention, there is provided a technique advantageous in suppressing degradation of a cathode.

DESCRIPTION OF EMBODIMENTS

Figure 1:
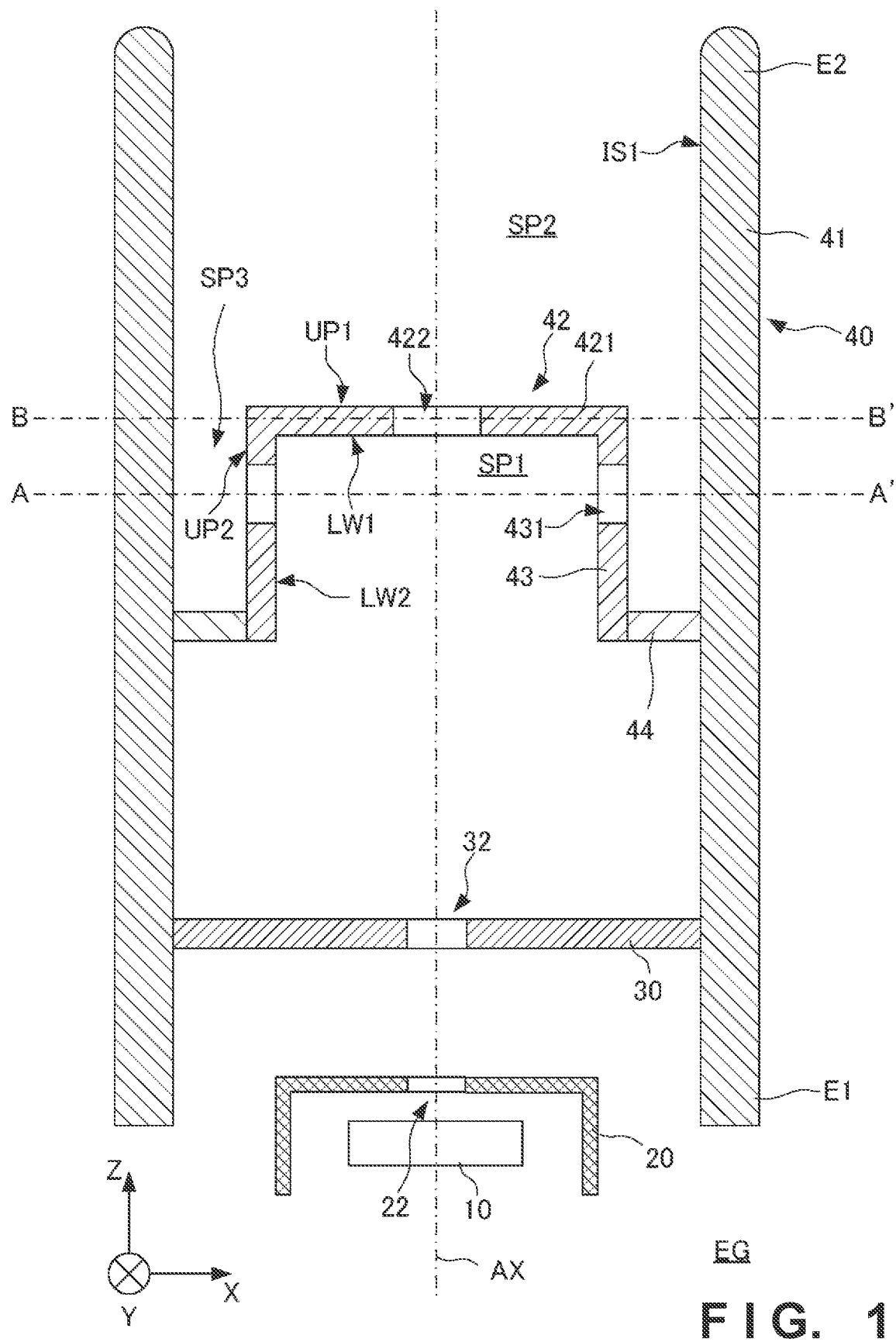
FIG. 1 is a sectional view schematically showing the arrangement of an electron gun according to the first embodiment of the present invention.

Hereinafter, embodiments will be described in detail with reference to the accompanying drawings. It should be noted that the following embodiments are not intended to limit the scope of the appended claims. A plurality of features are described in the embodiments. However, not all the combinations of the plurality of features are necessarily essential to the present invention, and the plurality of features may arbitrarily be combined. In addition, the same reference numerals denote the same or similar parts in the accompanying drawings, and a repetitive description will be omitted.

Figure 2:
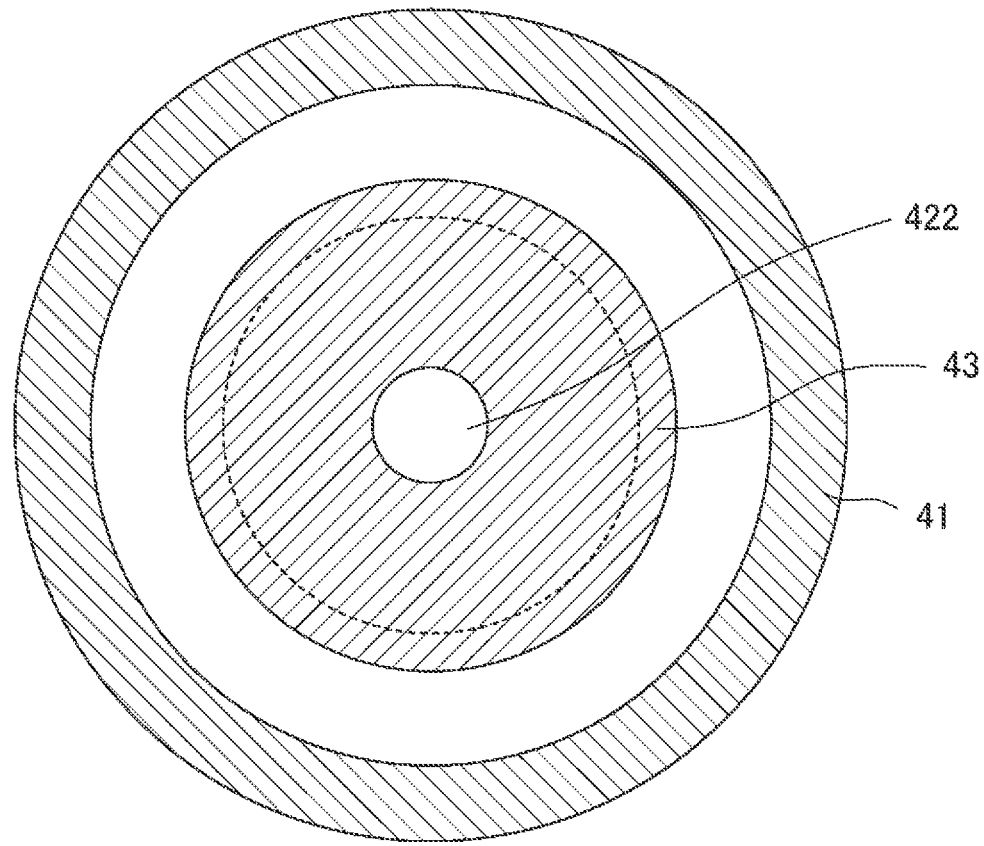
FIG. 2 is a view showing the first example of a section taken along a line B-B' in FIG. 1.
Figure 3:
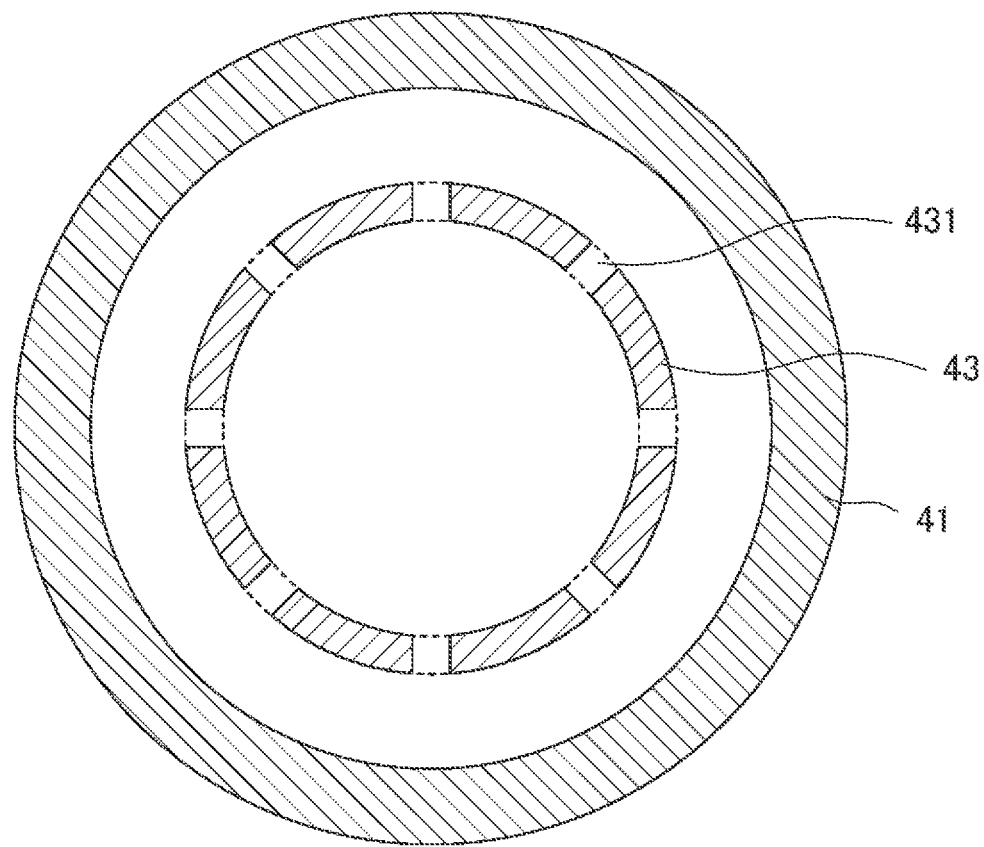
FIG. 3 is a view showing the first example of a section taken along a line A-A' in FIG. 1.
Figure 3:
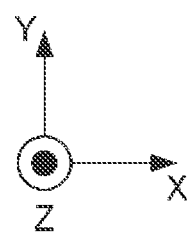
Figure 4:
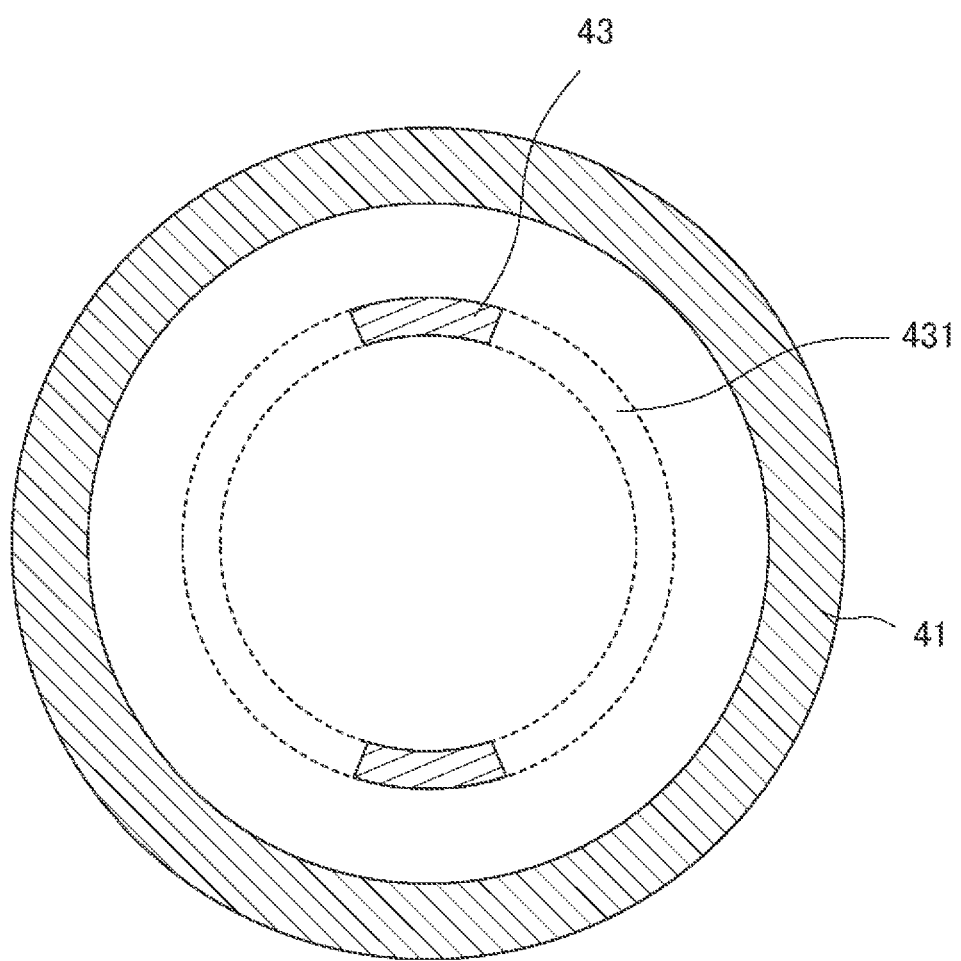
FIG. 4 is a view showing the second example of the section taken along the line A-A' in FIG. 1.
Figure 5:
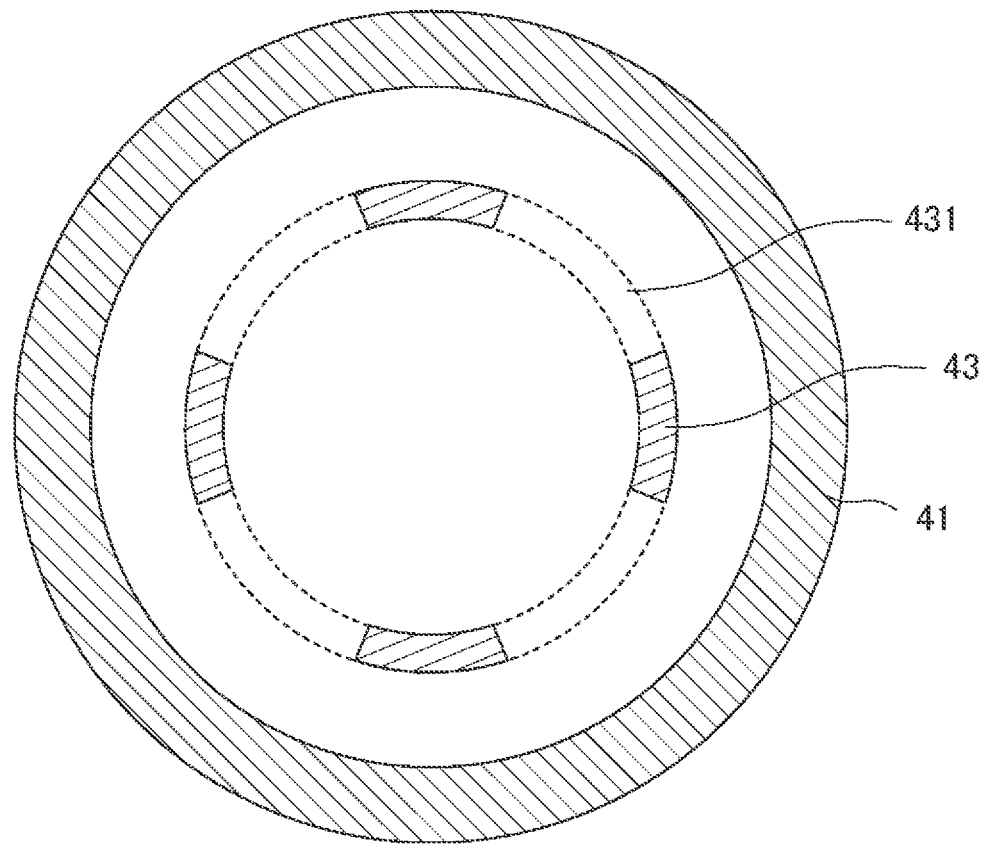
FIG. 5 is a view showing the third example of the section taken along the line A-A' in FIG. 1.

FIG. 1 schematically shows the arrangement of an electron gun EG according to the first embodiment of the present invention. FIG. 2 shows a section taken along a line B-B' in FIG. 1. FIG. 3 shows the first example of a section taken along a line A-A' in FIG. 1. FIG. 4 shows the second example of the section taken along the line A-A' in FIG. 1. FIG. 5 shows the third example of the section taken along the line A-A' in FIG. 1. The electron gun EG can be arranged in a vacuum container (not shown) and used. The electron gun EG is not limited to a specific application purpose and can be used as a part of an X-ray generation apparatus to be described later, or can be used in other electron beam application apparatuses such as an electron microscope and an electron beam drawing apparatus.

The electron gun EG can include a cathode 10 including an electron emitting portion that emits electrons, an extraction electrode 30 that extracts the electrons emitted from the electron emitting portion, and a focusing electrode 40 that focuses the electrons extracted by the extraction electrode 30. The cathode 10 can include, for example, a filament as the electron emitting portion. The electrons can be emitted when the filament is heated. The extraction electrode 30 includes a passage hole 32 through which electrons pass. The electron gun EG may include a gate electrode 20 between the cathode 10 and the extraction electrode 30. The gate electrode 20 includes a passage hole 22 through which electrons pass.

The focusing electrode 40 can include an outside electrode 41 having a tubular shape, and an inside electrode 42 arranged inside the outside electrode 41. The inside electrode 42 can include an inside surface located on the side of the cathode 10, and an outside surface on the opposite side of the inside surface. The inside surface of the inside electrode 42 can include a first inside surface LW1 (first surface) and a second inside surface LW2 having an angle with respect to the first inside surface LW1. The outside surface of the inside electrode 42 can include a first outside surface UP1 (second surface) and a second outside surface UP2 located on the opposite side of the second inside surface LW2 and having an angle with respect to the first outside surface UP1.

A first space SP1 can be defined by the inside surfaces LW1 and LW2 of the inside electrode 42. In another viewpoint, part of the first space SP1 can be defined by the first inside surface LW1 or the second inside surface LW2 of the inside electrode 42. In another viewpoint, (the inside surfaces LW1 and LW2 of) the inside electrode 42 can define the columnar (for example, cylindrical) first space SP1 inside the inside electrode 42.

In addition, a second space SP2 can be defined by the first outside surface UP1 of the inside electrode 42 and an inside surface IS1 of the outside electrode 41. Furthermore, a third space SP3 can be defined by the second outside surface UP2 of the inside electrode 42 and the inside surface IS1 of the outside electrode 41. The inside electrode 42 can include an electron passage hole 422 through which electrons pass, and a communicating portion 431 that makes the first space SP1 and the third space SP3 communicate with each other. In another viewpoint, the communicating portion 431 makes the inside space (first space SP1) of the inside electrode 42 communicate with the outside spaces (the second space SP2 and the third space SP3) formed by the outside surfaces UP1 and UP2 of the inside electrode 42 and the inside surface IS1 of the outside electrode 41.

The inside electrode 42 can include a plate portion 421 with the electron passage hole 422, and a tubular portion 43 having a tubular shape. In another viewpoint, one end of the tubular portion 43 can be connected to the plate portion 421. The focusing electrode 40 can further include a connecting portion 44 that connects the other end of the tubular portion 43 and the outside electrode 41. The connecting portion 44 may be formed by a conductive member, or may be formed by an insulator. The communicating portion 431 of the inside electrode 42 can make the first space SP1 communicate with the second space SP2 via the third space SP3. The communicating portion 431 can be provided in the tubular portion 43.

The outside electrode 41 and the inside electrode 42 can be configured to have a coaxial structure with respect to an axis AX. The outside electrode 41 can include a cylindrical portion with respect to the axis AX as the center axis. The inside electrode 42 can include a cylindrical portion with respect to the axis AX as the center axis. The outside electrode 41 can be arranged to surround the side of the inside electrode 42 throughout the perimeter. Alternatively, the outside electrode 41 can be arranged to surround the inside electrode 42 throughout the perimeter in any section that is orthogonal to the axis AX and cuts the inside electrode 42. In another viewpoint, the outside electrode 41 can be arranged to surround the communicating portion 431 of the inside electrode 42. Alternatively, the outside electrode 41 can be arranged to surround the communicating portion 431 of the inside electrode 42 in any section that is orthogonal to the axis AX and cuts the communicating portion 431 of the inside electrode 42. The above-described arrangement is effective to suppress discharge between the inside electrode 42 of the focusing electrode 40 and a member (not shown) that can be arranged outside the focusing electrode 40. This particularly advantageously acts in a case in which the inside electrode 42 includes a portion with a small radius of curvature (a portion with a large curvature) that can induce discharge.

In an example, the first space SP1 can be defined by the extraction electrode 30 in addition to the inside electrode 42. The first space SP1 is not a closed space and communicates with the second space SP2 via the electron passage hole 422 and the communicating portion 431. In addition, the first space SP1 communicates with the space on the side of the cathode 10 via the passage hole 32.

Figure 10:
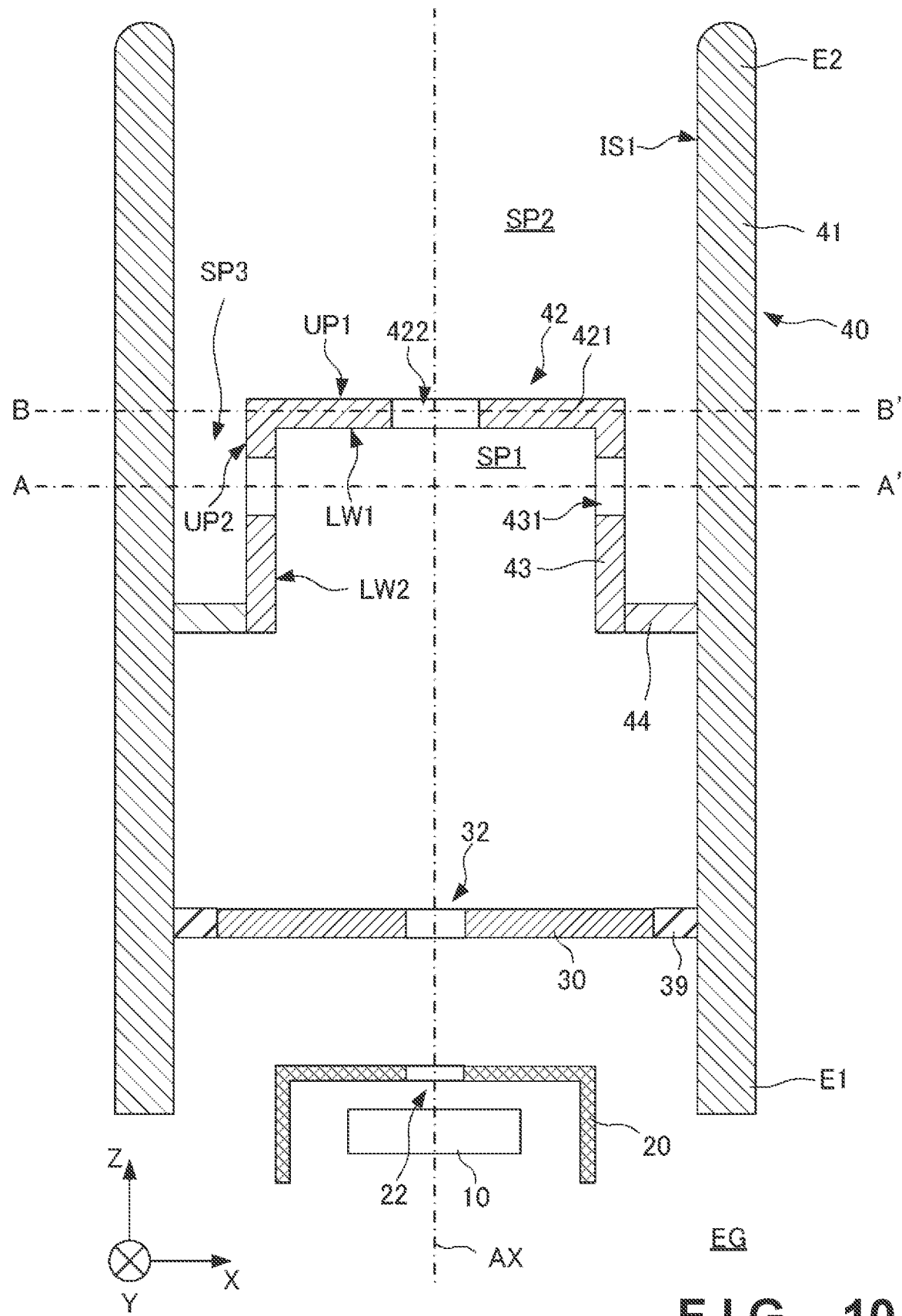
FIG. 10 is a sectional view schematically showing the arrangement of a modification of the electron gun according to the first embodiment of the present invention.

The outside electrode 41 and the inside electrode 42 are electrically connected to each other and can be given the same potential. Alternatively, the outside electrode 41, the inside electrode 42, and the connecting portion 44 are electrically connected to each other and can be given the same potential. The extraction electrode 30 may electrically be connected to the inside electrode 42, or may electrically be insulated from the inside electrode 42 and given a potential different from a potential given to the inside electrode 42. In an example, the extraction electrode 30 is fixed to the focusing electrode 40. FIG. 10 shows a modification of the first embodiment. In an example shown in FIG. 10, the extraction electrode 30 is supported by the focusing electrode 40 (outside electrode 41) via an insulator 39.

The plate portion 421 provided in the inside electrode 42 of the focusing electrode 40 limits the diameter of an electron beam reaching the second space SP2. Only electrons that have passed through the electron passage hole 422 provided in the plate portion 421 form the electron beam reaching the second space SP2. The remaining electrons collide against the plate portion 421 and are absorbed by the plate portion 421. When the plate portion 421 including the electron passage hole 422 is provided in the inside electrode 42, the electron beam emitted from the electron gun EG can be focused to a smaller region.

When electrons from the cathode 10 collide against the plate portion 421, a gas can be emitted from the plate portion 421. If the gas stays in the first space SP1 for a long time, the probability that the electrons from the cathode 10 collide against the gas rises. The gas can be ionized by the collision between the electrons and the gas. Thus generated ions are accelerated toward the cathode 10 and can collide against the cathode 10. This can cause degradation of the cathode 10. To prevent this, in the electron gun EG according to the first embodiment, the communicating portion 431 that makes the first space SP1 and the second space SP2 communicate is provided in the inside electrode 42. The communicating portion 431 can be arranged at a position where the electrons do not become incident on it or at a position where the possibility of incidence of the electrons is low. In another viewpoint, the communicating portion 431 can be arranged at a position where the electrons do not pass. The communicating portion 431 allows the gas that can be generated in the first space SP1 to be quickly discharged from the first space SP1 to the second space SP2. This functions to suppress degradation of the cathode 10.

The focusing electrode 40 may be formed such that a linear path via the communicating portion 431 exists between the inside surface IS1 of the outside electrode 41 and a region of the plate portion 421 where the electrons can collide. Alternatively, the focusing electrode 40 may be formed such that a linear path via the communicating portion 431 exists between the electron passage hole 422 provided in the plate portion 421 and the inside surface IS1 of the outside electrode 41. Such an arrangement allows the gas that can be generated by the collision of electrons against the plate portion 421 to be quickly discharged to the second space SP2 (or the third space SP3).

As shown in FIGS. 3, 4, and 5, a plurality of communicating portions 431 can be provided in the inside electrode 42. However, only a single communicating portion 431 may be provided in the inside electrode 42. In a section (section taken along the line A-A') that is orthogonal to the axis AX and cuts the communicating portion 431, the ratio of the area of the communicating portion 431 to the area of the inside electrode 42 (the portion other than the communicating portion 431) can arbitrarily be determined. However, in a structure in which the outside electrode 41 and the inside electrode 42 are set to the same potential, the influence of the existence of the communicating portion 431 on the function of focusing the electrons from the cathode 10 is small. Hence, in such a structure, in the section (section taken along the line A-A') that is orthogonal to the axis AX and cuts the communicating portion 431, the area of the communicating portion 431 can be made larger than the area of the inside electrode 42 (the portion other than the communicating portion 431). This is advantageous in quickly discharging the gas from the first space SP1 to the second space SP2.

The outside electrode 41 includes a first end E1 on the side of the electron emitting portion of the cathode 10, and a second end E2 on the opposite side of the first end E1. The second end E2 can be formed not to have any angular portion. Such an arrangement is effective to suppress discharge between the outside electrode 41 and a member that can be arranged outside it.

Figure 6:
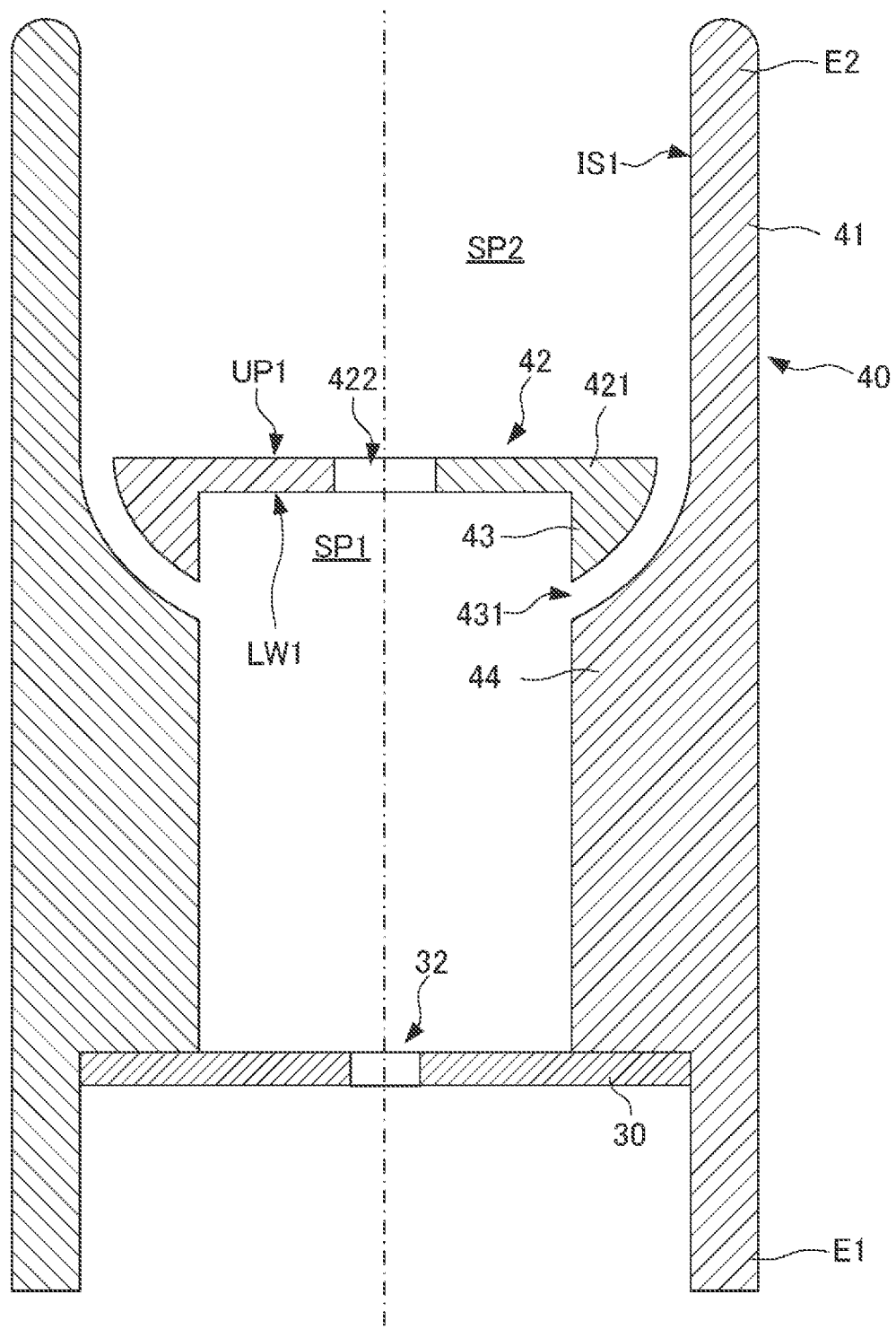
FIG. 6 is a sectional view schematically showing the arrangement of an electron gun according to the second embodiment of the present invention.

FIG. 6 schematically shows the arrangement of an electron gun EG according to the second embodiment of the present invention. Matters that are not mentioned as the second embodiment can comply with the first embodiment. In the second embodiment, a first space SP1 and a second space SP2 directly communicate by a communicating portion 431. Additionally, in the second embodiment, the communicating portion 431 forms a curved discharge path in a section parallel to an axis AX. In another viewpoint, in the second embodiment, the communicating portion 431 forms a discharge path that is neither parallel nor perpendicular to the axis AX in the section parallel to the axis AX.

Figure 7:
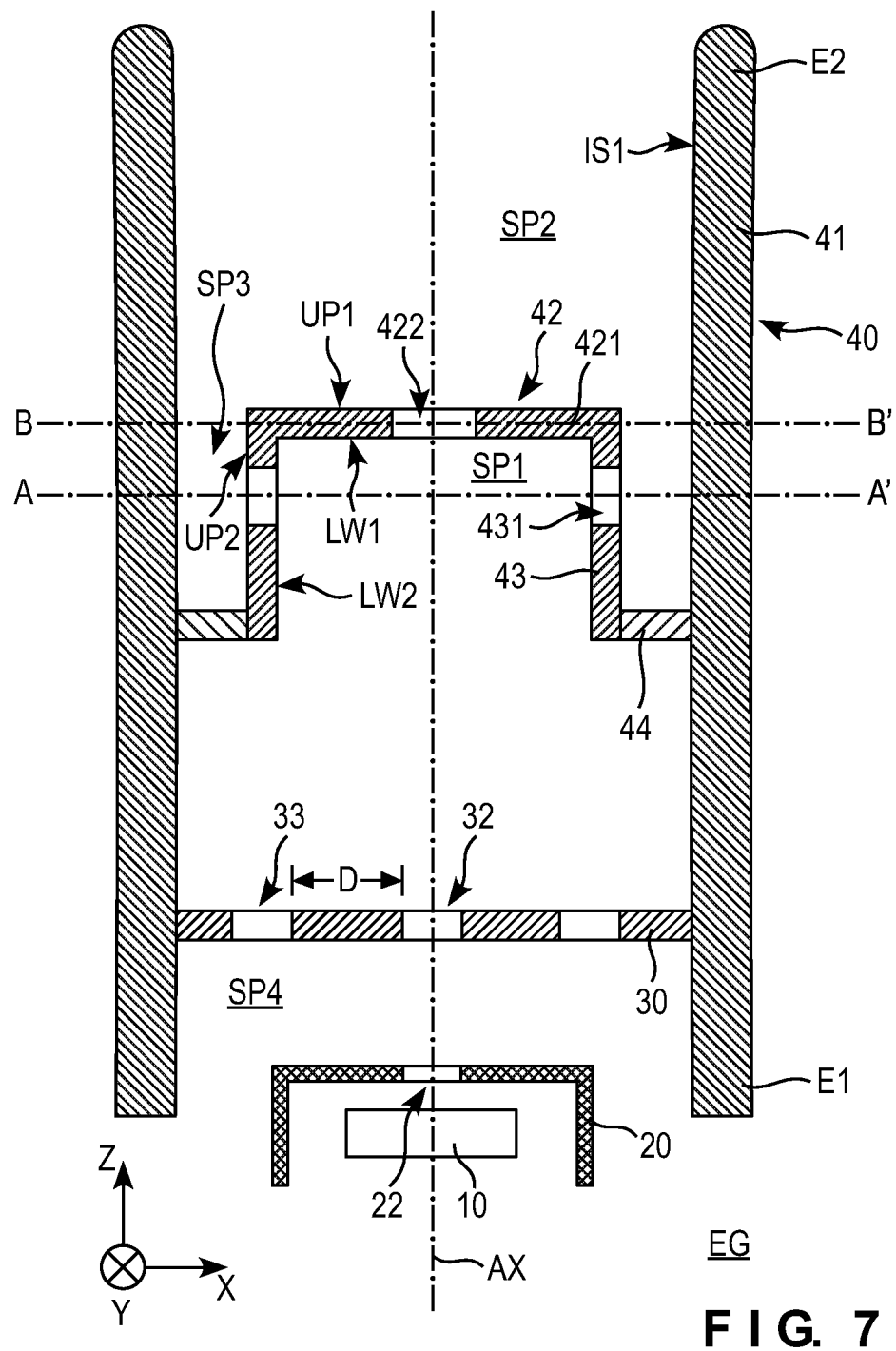
FIG. 7 is a sectional view schematically showing the arrangement of an electron gun according to the third embodiment of the present invention.

FIG. 7 schematically shows the arrangement of an electron gun EG according to the third embodiment of the present invention. Matters that are not mentioned as the third embodiment can comply with the first or second embodiment. In the third embodiment, an extraction electrode 30 defines part of a first space SP1. The extraction electrode 30 separates the first space SP1 from a fourth space SP4 on the side of a cathode 10. The extraction electrode 30 includes not only a passage hole 32 through which electrons pass but also a through hole 33 arranged apart from the passage hole 32. The passage hole 32 is spaced from the through hole by a distance D. The through hole 33 allows a gas that can be generated by collision of the electrons against a plate portion 421 to be discharged to the fourth space SP4.

In a viewpoint of reducing the influence of the through hole 33 on the orbit of the electrons from the cathode 10 and in a viewpoint of arranging the path of the gas discharged from the first space SP1 via the through hole 33 far from the cathode 10 and preventing degradation of the cathode 10 caused by ionization of the gas, the minimum distance between the passage hole 32 and the through hole 33 is preferably five times or more of the radius of the through hole 33. In addition, in a viewpoint of reducing the size of the electron gun EG, the minimum distance between the passage hole 32 and the through hole 33 is preferably 50 times or less of the radius of the through hole 33. Hence, the minimum distance between the passage hole 32 and the through hole 33 is preferably five times or more and 50 times or less of the radius of the through hole 33. The extraction electrode 30 can include a plurality of through holes 33. The plurality of through holes 33 can be arranged rotation-symmetrically with respect to an axis AX.

Figure 8:
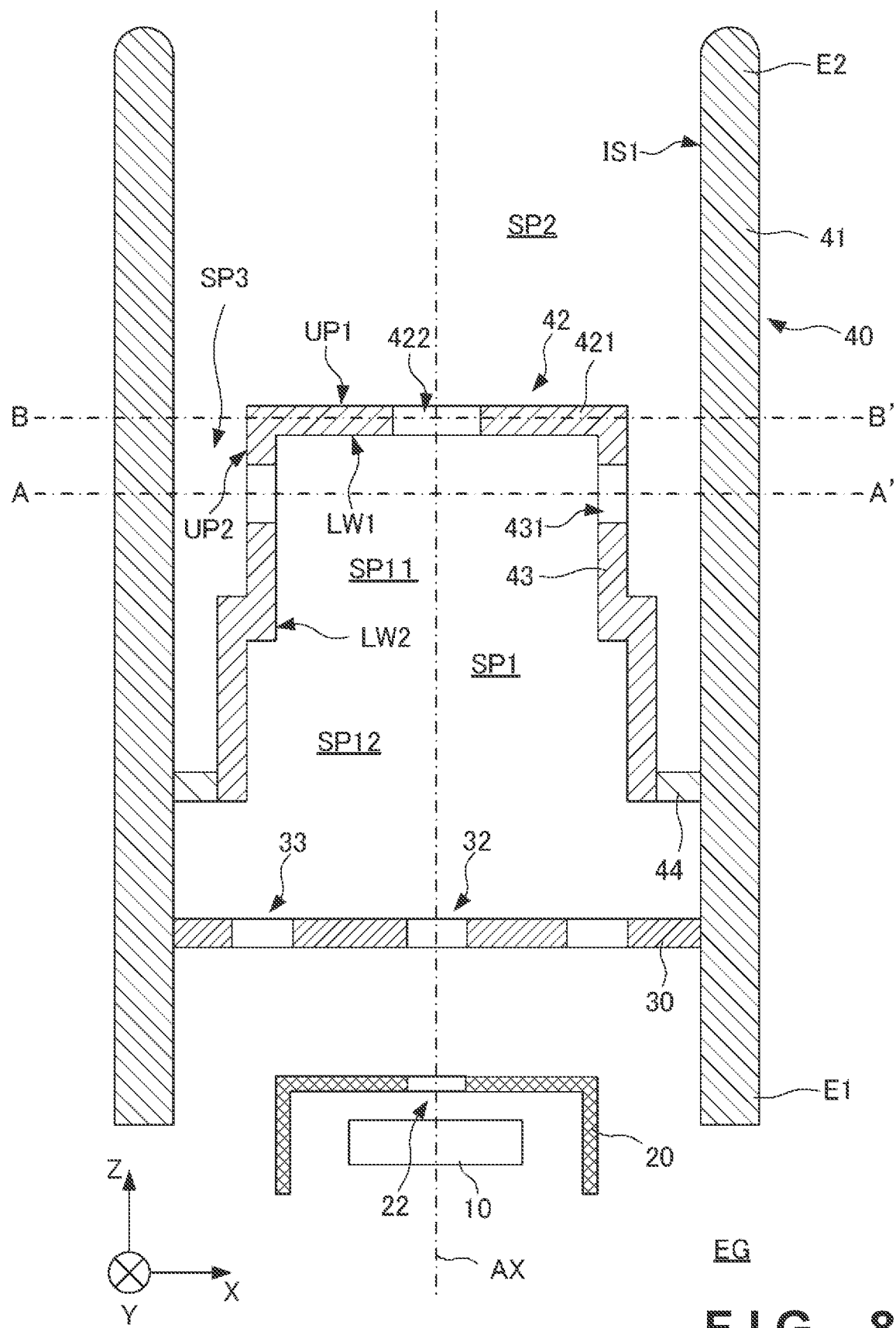
FIG. 8 is a sectional view schematically showing the arrangement of an electron gun according to the fourth embodiment of the present invention.

FIG. 8 schematically shows the arrangement of an electron gun EG according to the fourth embodiment of the present invention. Matters that are not mentioned as the fourth embodiment can comply with each of the first to third embodiments or a combination of two of them. In the fourth embodiment, a first space SP1 includes a first portion SP11 and a second portion SP12 between the first portion SP11 and an extraction electrode 30. The first portion SP11 and the second portion SP12 can be discriminated from each other by the dimension in a direction orthogonal to an axis AX of a focusing electrode 40. The dimension of the second portion SP12 in the direction orthogonal to the axis AX of the focusing electrode 40 is larger than the dimension of the first portion SP11 in the direction orthogonal to the axis AX. Note that the portion of an inside electrode 42 that defines the second portion SP12 is spaced apart from an outside electrode 41 in FIG. 8, but may be in contact with the outside electrode 41. This arrangement is advantageous in increasing the distance between a through hole 33 and a passage hole 32.

Figure 9:
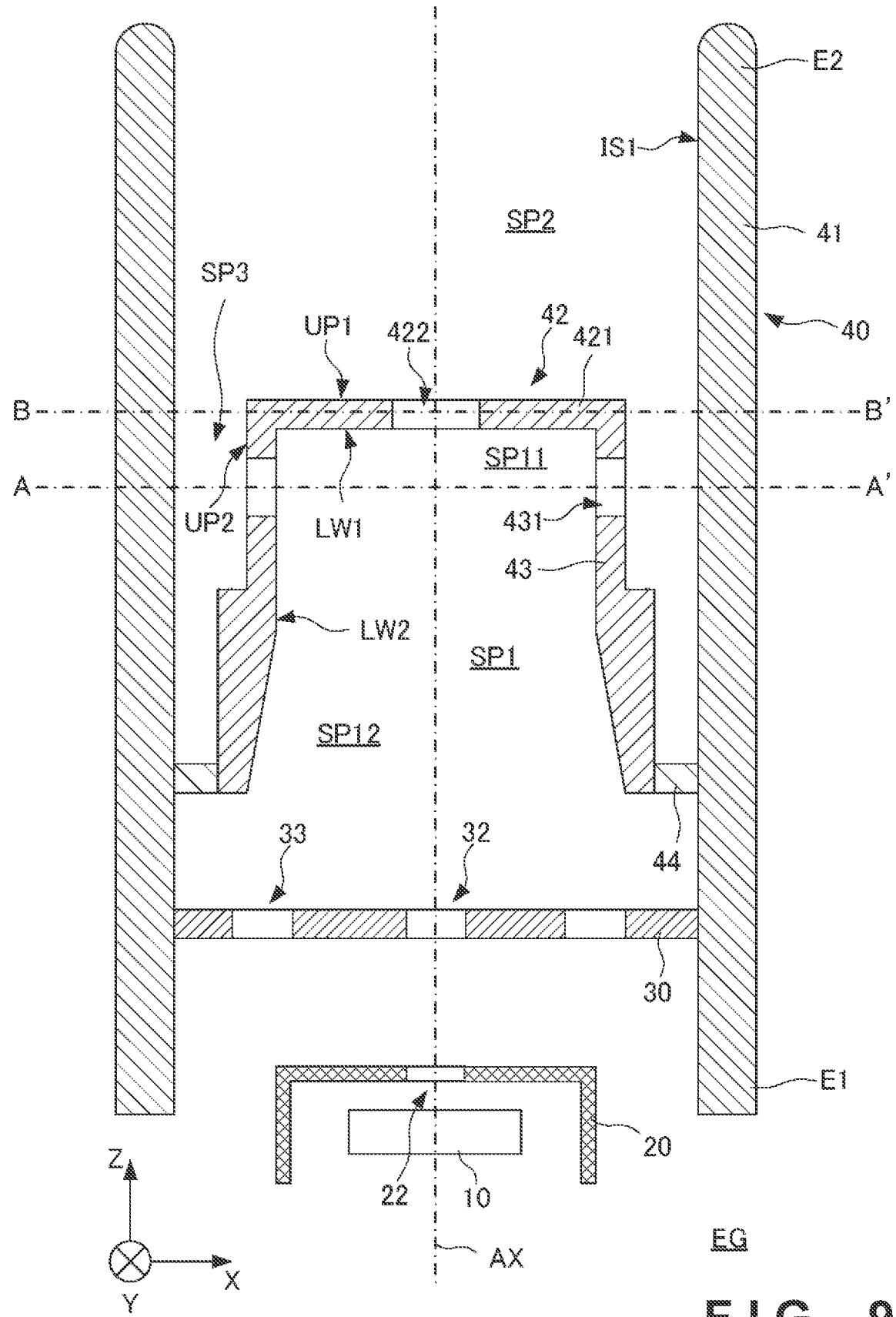
FIG. 9 is a sectional view schematically showing the arrangement of an electron gun according to the fifth embodiment of the present invention.

FIG. 9 schematically shows the arrangement of an electron gun EG according to the fifth embodiment of the present invention. Matters that are not mentioned as the fifth embodiment can comply with each of the first to fourth embodiments or a combination of two or more of them. In the fifth embodiment, a first space SP1 includes a first portion SP11 and a second portion SP12 between the first portion SP11 and an extraction electrode 30. The first portion SP11 and the second portion SP12 can be discriminated from each other by the dimension in a direction orthogonal to an axis AX of a focusing electrode 40. The dimension of the second portion SP12 in the direction orthogonal to the axis AX of the focusing electrode 40 is larger than the dimension of the first portion SP11 in the direction orthogonal to the axis AX. In the fifth embodiment, the dimension of the second portion SP12 in the direction orthogonal to the axis AX of the focusing electrode 40 becomes large toward the side of a cathode 10. This arrangement is advantageous in increasing the distance between a through hole 33 and a passage hole 32.

Figure 11:
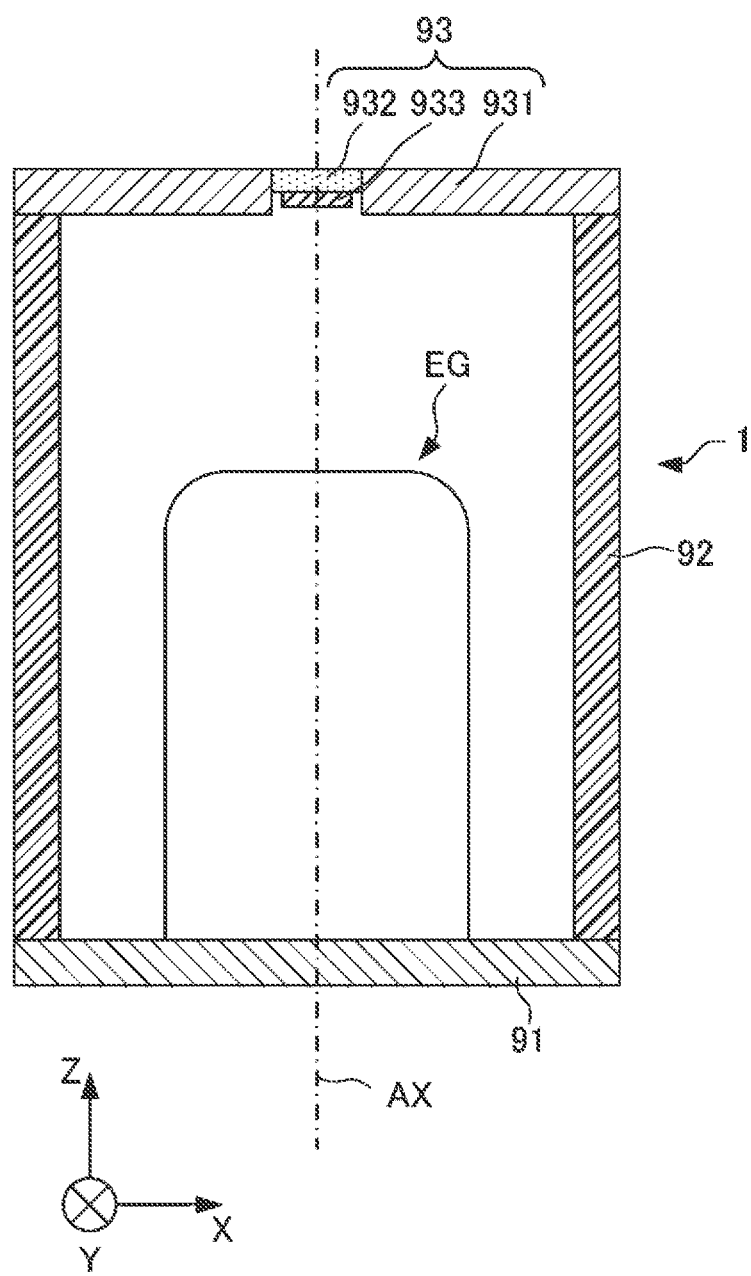
FIG. 11 is a view schematically showing the arrangement of an X-ray generation apparatus according to an embodiment of the present invention.

FIG. 11 schematically shows the arrangement of an X-ray generation tube 1 according to an embodiment of the present invention. The X-ray generation tube 1 can include an electron gun EG according to any one of the first to fifth embodiments, and an anode 93 including a target 933 that generates X-rays when electrons from the electron gun EG collide. The X-ray generation tube 1 includes a cathode 91, and the cathode 91 can be electrically connected to a cathode 10 of the electron gun EG. The X-ray generation tube 1 includes an insulating tube 92. The anode 93 can be arranged to close one of the two opening ends of the insulating tube 92, and the cathode 91 can be arranged to close the other of the two opening ends of the insulating tube 92.

The anode 93 can include the target 933, a target holding plate 932 that holds the target 933, and an electrode 931 that holds the target holding plate 932. The electrode 931 is electrically connected to the target 933 and gives a potential to the target 933. The target 933 generates X-rays when electrons from the electron gun EG collide against the target 933. The generated X-rays are transmitted through the target holding plate 932 and radiated to the outside of the X-ray generation tube 1. The anode 93 can be maintained at, for example, the ground potential but may be maintained at another potential. The target 933 can be made of a material having a high melting point and a high X-ray generation efficiency, for example, tungsten, tantalum, or molybdenum. The target holding plate 932 can be made of, for example, a conductive material through which X-rays pass, for example, beryllium, diamond, or the like.

Figure 12:
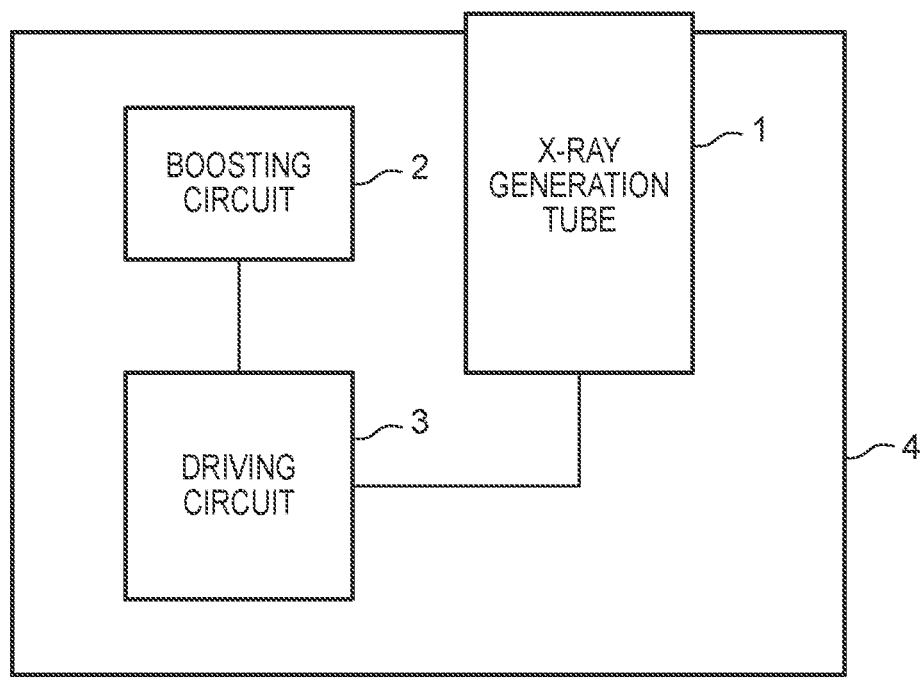
FIG. 12 is a view showing the arrangement of the X-ray generation apparatus according to an embodiment of the present invention.

FIG. 12 shows the arrangement of an X-ray generation apparatus 100 according to an embodiment of the present invention. The X-ray generation apparatus 100 can include the above-described X-ray generation tube 1, and a driving circuit 3 that drives the X-ray generation tube 1. The X-ray generation apparatus 100 can further include a boosting circuit 2 that supplies a boosted voltage to the driving circuit 3. The X-ray generation apparatus 100 can further include a storage container 4 that stores the X-ray generation tube 1, the driving circuit 3, and the boosting circuit 2. The storage container 4 can be filled with insulating oil.

Figure 13:
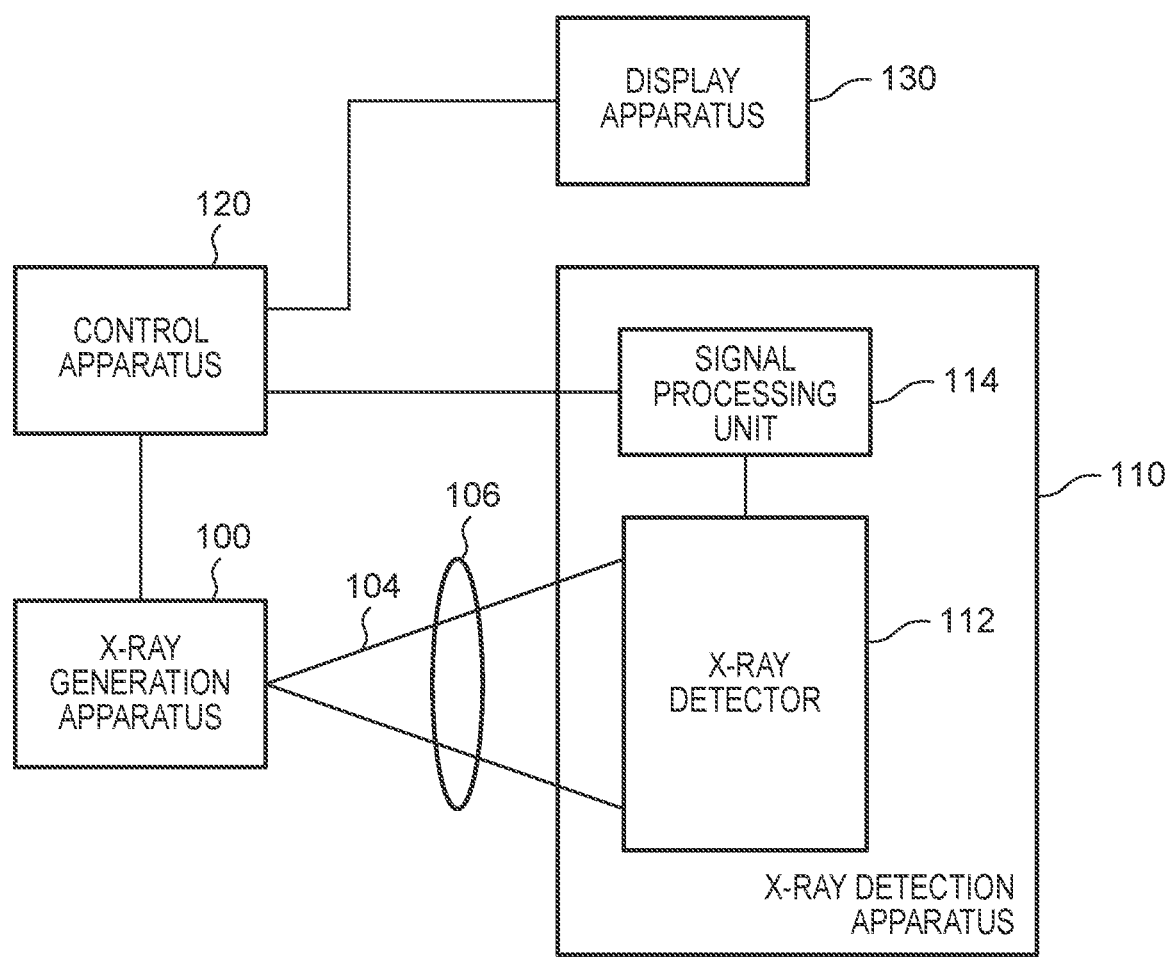
FIG. 13 is a view showing the arrangement of an X-ray imaging apparatus according to an embodiment of the present invention.

FIG. 13 shows the arrangement of an X-ray imaging apparatus 200 according to an embodiment of the present invention. The X-ray imaging apparatus 200 can include the X-ray generation apparatus 100, and an X-ray detection apparatus 110 that detects X-rays 104 radiated from the X-ray generation apparatus 100 and transmitted through an object 106. The X-ray imaging apparatus 200 may further include a control apparatus 120 and a display apparatus 130. The X-ray detection apparatus 110 can include an X-ray detector 112 and a signal processing unit 114. The control apparatus 120 can control the X-ray generation apparatus 100 and the X-ray detection apparatus 110. The X-ray detector 112 detects or captures the X-rays 104 radiated from the X-ray generation apparatus 100 and transmitted through the object 106. The signal processing unit 114 can process a signal output from the X-ray detector 112 and supply the processed signal to the control apparatus 120. The control apparatus 120 causes the display apparatus 130 to display an image based on the signal supplied from the signal processing unit 114.

The present invention is not limited to the above embodiments, and various changes and modifications can be made within the spirit and scope of the present invention. Therefore, to apprise the public of the scope of the present invention, the following claims are made.

The invention claimed is:

1. An electron gun comprising a cathode including an electron emitting portion, an extraction electrode configured to extract electrons emitted from the electron emitting portion, and a focusing electrode configured to focus the electrons extracted by the extraction electrode, wherein
the focusing electrode includes an outside electrode having a tubular shape, and an inside electrode arranged inside the outside electrode so as to be surrounded by the outside electrode, the inside electrode defines a first space having a columnar shape, and includes a first surface on a side of the cathode, and a second surface on an opposite side of the first surface, and an inside surface of the outside electrode and the second surface of the inside electrode define a second space, and
the inside electrode includes an electron passage hole through which the electrons pass, and a communicating portion arranged apart from the electron passage hole and configured to make the first space and the second space communicate with each other.

2. The electron gun according to claim 1, wherein the outside electrode surrounds the communicating portion.

3. The electron gun according to claim 1, wherein the inside electrode includes a plate portion including the electron passage hole, and a tubular portion having a tubular shape, the tubular portion having one end connected to the plate portion, and
the communicating portion is provided in the tubular portion.

4. The electron gun according to claim 1, wherein the extraction electrode includes a passage hole through which the electrons pass, and a through hole arranged apart from the passage hole.

5. The electron gun according to claim 1, wherein the extraction electrode is fixed to the focusing electrode.

6. The electron gun according to claim 1, wherein the extraction electrode is electrically connected to the focusing electrode.

7. An X-ray generation apparatus comprising:
the electron gun according to claim 1; and
an anode including a target configured to generate X-rays when electrons from the electron gun collide.

8. The electron gun according to claim 1, wherein the inside electrode is arranged inside the outside electrode so as to be surrounded by the outside electrode in a cross section orthogonal to an axis of the focusing electrode.

9. The electron gun according to claim 3, wherein a third space is defined between an outside surface of the tubular portion and the inside surface of the outside electrode, and the communicating portion of the inside electrode makes the first space and the second space communicate with each other via the third space.

10. The electron gun according to claim 4, wherein the first space includes a first portion and a second portion between the first portion and the extraction electrode, and a dimension of the second portion in a direction orthogonal to an axis of the focusing electrode is larger than a dimension of the first portion in the direction orthogonal to the axis of the focusing electrode.

11. The electron gun according to claim 4, wherein a minimum distance between the passage hole and the through hole is not less than five times and not more than 50 times of a radius of the through hole.

12. The electron gun according to claim 10, wherein the dimension of the second portion becomes larger toward the side of the cathode.

13. An X-ray imaging apparatus comprising:
the X-ray generation apparatus according to claim 7; and
an X-ray detection apparatus configured to detect X-rays radiated from the X-ray generation apparatus and transmitted through an object.

\* \* \* \* \*